US006903416B2

(12) United States Patent
Henninger et al.

(10) Patent No.: US 6,903,416 B2
(45) Date of Patent: Jun. 7, 2005

(54) TRENCH TRANSISTORS AND METHODS FOR FABRICATING TRENCH TRANSISTORS

(75) Inventors: Ralf Henninger, München (DE); Franz Hirler, Isen (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/673,966

(22) Filed: Sep. 29, 2003

(65) Prior Publication Data

US 2004/0104428 A1 Jun. 3, 2004

(30) Foreign Application Priority Data

Sep. 27, 2002 (DE) .......................... 102 45 249

(51) Int. Cl.[7] ...................... H01L 27/108; H01L 29/76; H01L 29/94; H01L 31/113; H01L 31/119
(52) U.S. Cl. ...................... 257/330; 257/329; 257/332; 257/335
(58) Field of Search ................. 257/328–342

(56) References Cited

U.S. PATENT DOCUMENTS

| 5,177,572 | A | | 1/1993 | Murakami | |
|---|---|---|---|---|---|
| 5,283,201 | A | | 2/1994 | Tsang et al. | |
| 5,342,797 | A | | 8/1994 | Sapp et al. | |
| 5,801,417 | A | | 9/1998 | Tsang et al. | |
| 6,188,105 | B1 | * | 2/2001 | Kocon et al. | ............... 257/330 |
| 6,498,071 | B2 | * | 12/2002 | Hijzen et al. | ............... 438/425 |
| 2002/0115257 | A1 | * | 8/2002 | Inagawa et al. | ............ 438/270 |
| 2002/0140026 | A1 | * | 10/2002 | Ishikawa et al. | ............ 257/330 |

FOREIGN PATENT DOCUMENTS

| DE | 41 11 046 A1 | 10/1991 |
|---|---|---|
| EP | 0 962 987 A2 | 12/1999 |

* cited by examiner

Primary Examiner—Shouxiang Hu
(74) Attorney, Agent, or Firm—Laurence A. Greenberg; Werner H. Stemer; Ralph E. Locher

(57) ABSTRACT

A trench transistor has a source zone introduced from a doped spacer into a body region and a channel running vertically along the insulation layer of the trench. A method is taught for fabricating the trench transistor of this type.

11 Claims, 6 Drawing Sheets

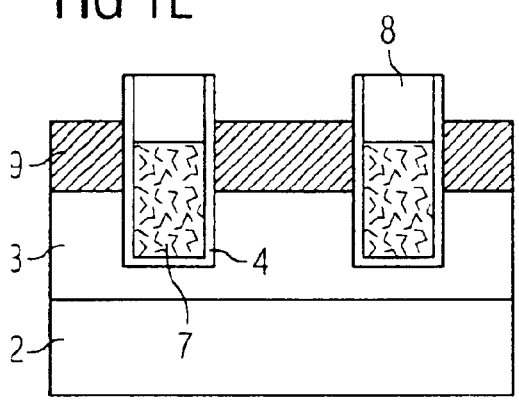
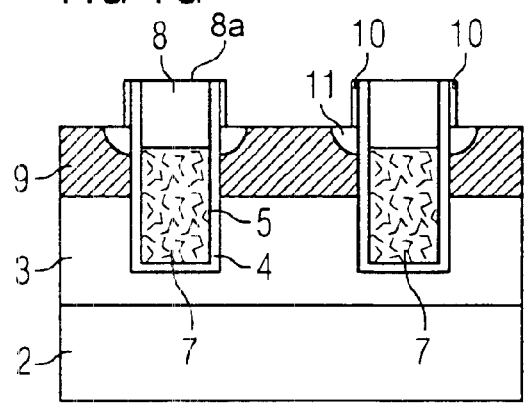
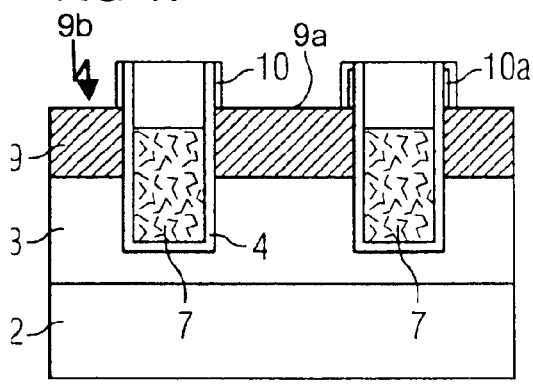
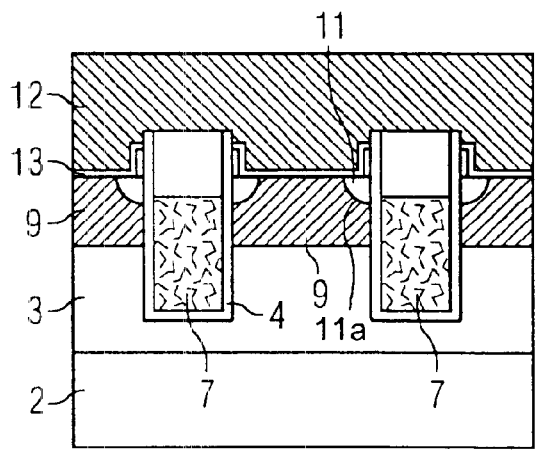

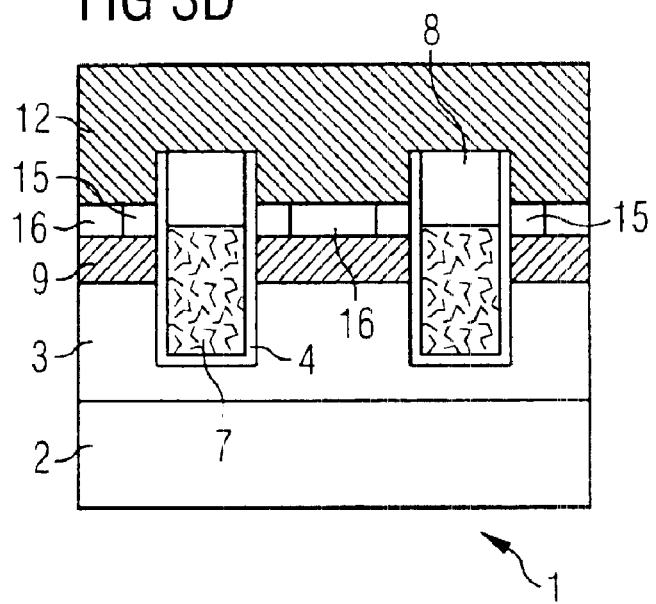
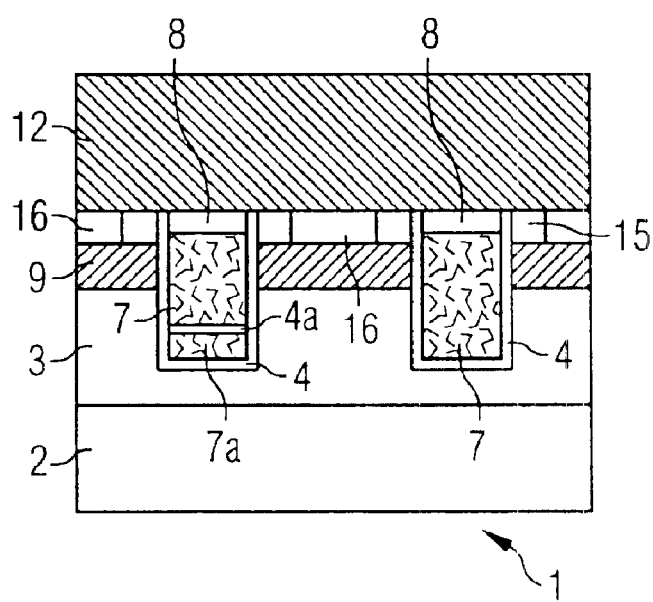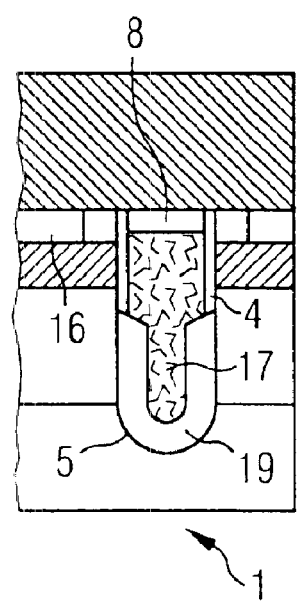

TRENCH TRANSISTORS AND METHODS FOR FABRICATING TRENCH TRANSISTORS

BACKGROUND OF THE INVENTION

FIELD OF THE INVENTION

The present invention relates to a trench transistor, having a semiconductor body of one conduction type, a semiconductor region of the other conduction type, opposite to the first conduction type, provided in a surface region of the semiconductor body, a trench which extends from the top downward from the uncovered surface of the semiconductor region through the semiconductor region as far as the semiconductor body, an insulation layer which at least partially lines the wall of the trench, a conductive trench filling in the lower region of the trench, an insulating trench filling in the upper region of the trench, and a semiconductor zone of the first conduction type provided along the insulation layer in the semiconductor region, wherein the upper end of the insulation layer and the surface of the insulating trench filling at least partially project above the surface of the semiconductor region, and the lower edge of the semiconductor zone lies at a lower level than the top side, adjoining the insulating trench filling, of the conductive trench filling. The present invention also relates to a method for fabricating a trench transistor of this type.

A trench transistor of the type described in the introduction, but in which the lower edge of the semiconductor zone of the first conduction type (source zone) is located well below the top side of the conductive trench filling, is described, for example, in U.S. Pat. Nos. 5,801,417 and 5,283,201 (cf. FIG. 12 of each of those documents). In the case of this known trench transistor, a spacer layer that adjoins the source zone and is provided above the latter along the side wall of the trench is used to provide electrical insulation between the conductive trench filling and a front surface metalization for the source zone and the semiconductor region of the opposite conduction type (body zone). The source zone itself is produced by etching back a strongly doped semiconductor region of one conduction type between two adjacent trenches.

In power electronics, it is generally desired to reduce the area-specific on resistance of transistors. In doing so, it is, of course, desirable to retain properties such as avalanche strength and low capacitances for rapid switching and if appropriate even to further improve these properties. By reducing the feature sizes, it is generally possible to achieve the objective of a lower on resistance by increasing the area-specific channel width of a power transistor. To ensure a high avalanche strength, however, it is necessary to provide structures for power transistors which locally limit the breakdown at these transistors or prevent parasitic bipolar transistors from being switched on. The extent to which the feature sizes can be reduced reaches its limit at the minimum feature size, which is substantially determined by the accuracy of patterning by photographic techniques.

The accuracy that can be achieved when patterning individual semiconductor zones using mask steps is limited by the misalignment of the respective photographic planes used to form these semiconductor zones relative to structures which have already been formed in the semiconductor body, resist properties of the photoresist used during exposure and imaging errors. Although the most up-to-date exposure techniques can be used to further improve the accuracy with which the smallest features can be produced relative to one another, the outlay involved is extremely high and expensive.

SUMMARY OF THE INVENTION

It is accordingly an object of the invention to provide trench transistors and methods for fabricating trench transistors that overcome the hereinafore-mentioned disadvantages of the heretofore-known devices of this general type and that are distinguished by extremely small feature sizes and that can be fabricated without major outlay. A further object of the invention is to provide a method for fabricating a trench transistor of this type.

With the foregoing and other objects in view, there is provided, in accordance with the invention, a first exemplary embodiment wherein the zone of the first conduction type, i.e. the source zone, is formed by diffusion out of a spacer, so that this zone has a very small lateral extent. In one refinement of the invention, the spacer itself may include an insulating spacer layer, which thickens the gate dielectric of the trench transistor, and a conductive spacer layer. Suitable materials for the spacer or the conductive spacer layer are doped polycrystalline silicon or amorphous silicon or a metal provided with dopant or borophosphosilicate glass (BPSG) or phosphosilicate glass (PSG). The dopant of the spacer is selected in such a way that it results in the first conduction type in the semiconductor zone. In any event, the spacer or the conductive spacer layer in the case of a spacer including an insulating spacer layer and the conductive spacer layer acts as a dopant source for the zone of the first conduction type, i.e. the source zone. The small lateral extent of the source zone that is thereby produced allows it to minimize significantly the strengthening of the parasitic bipolar transistor in the trench transistor according to the invention.

In another exemplary embodiment of the invention, a body contact zone of the other conduction type is provided between two semiconductor zones (source zones) of the first conduction type of two adjacent cells and is produced by reversing the doping of regions of these semiconductor zones.

With the objects of the invention in view, there is also provided a method of self-aligned process steps for forming the semiconductor zones that are critical to an avalanche breakdown, and in particular for the lateral formation of these semiconductor zones, i.e. source zones, allows the feature size to be reduced considerably in the trench transistor according to the invention. Disadvantageous effects of sidewall implantation resulting from the surface lying at a lower level in the region of the trench can be reliably avoided.

The method according to the invention is distinguished by the fact that cost-intensive photographic levels can be eliminated with a high degree of self-alignment.

The trench transistor according to the invention may be a MOS transistor, an IGBT, etc. Examples of suitable semiconductor materials are silicon or silicon carbide.

In the case of the trench transistor according to the invention, it is expedient for a trench to be introduced into the surface of the semiconductor region of the other conduction type between two cells. This can be effected, for example, by trench etching. A trench of this type improves the robustness of the semiconductor component, because a breakdown then occurs in the region of the trench and not in the region of the trench sidewall.

This is because if high field strengths occur in a semiconductor body made, for example, from silicon, this leads to charge multiplication. Electrodes and holes are present in the same way. For example, in the case of an n-channel vertical transistor, electrons flow to the back surface while holes are transported to the front surface. These holes can then make up a parasitic npn bipolar transistor, leading to current splitting and destruction of the component. In the case of a trench, however, the holes cannot flow along the source zone, preventing the parasitic npn bipolar transistor from being switched on. Moreover, the trench separates source zones of adjacent cells of the trench transistor.

Other features that are considered as characteristic for the invention are set forth in the appended claims.

Although the invention is illustrated and described herein as embodied in trench transistors and methods for fabricating trench transistors, it is nevertheless not intended to be limited to the details shown, because various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1A–1H are diagrammatic sectional views showing a sequence of steps of a process for fabricating a trench transistor with self-aligned source zone according to a first embodiment of the invention;

FIGS. 3A–3E are diagrammatic sectional views showing a sequence of steps of a process for fabricating a trench transistor with self-aligned body contact in a low-doped source zone according to a third embodiment of the invention; and FIG. 3E' is a diagrammatic section view showing a variant of the process with a field plate trench.

DESCRIPTION OF THE PREFERRED EMBODIMENTS

Figure 1A:
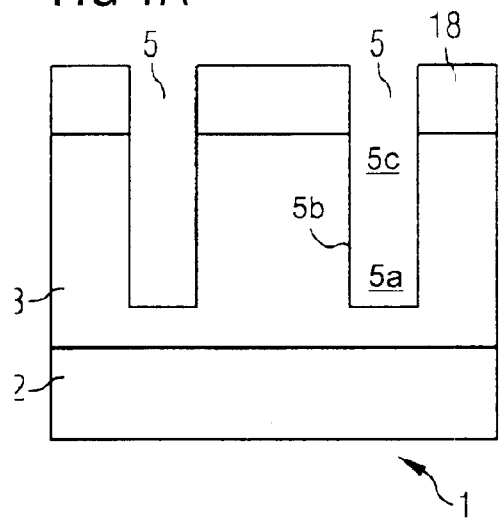

In all the figures of the drawing, sub-features and integral parts that correspond to one another bear the same reference symbol in each case.

Referring now to the figures of the drawings in detail, there is shown a semiconductor material that may preferably be silicon. However, consideration may also be given to the use of other semiconductor materials, such as for example silicon carbide or compound semiconductors ($A_{III}B_V$). It is also possible for the conduction types shown in each case to be swapped.

FIG. 1A shows a semiconductor body 1 including an $n^+$-conducting layer 2 and an $n^-$-conducting drift zone 3 provided thereon. The layer 2 and the drift zone 3 may be produced, for example by epitaxy. In the text that follows, it is assumed that at least the drift zone 3 or the layer that forms it has been produced by epitaxy.

Trenches 5 have been introduced into the drift zone 3 with the aid, for example, of a standard photoresist and etching technique and a hard mask made, for example, from a silicon dioxide layer 18. The width of a trench may, for example, be in the region of 1 $\mu$m. However, it may also be smaller or larger if desired. The distance between the trenches 5 is approximately 1 to 2 $\mu$m and may be smaller. As an alternative to the silicon dioxide layer 18, it is also possible to use another suitable masking layer to form the trenches 5. The trenches 5 have a wall 5b, a lower region 5a, and an upper region 5c.

Figure 1C:
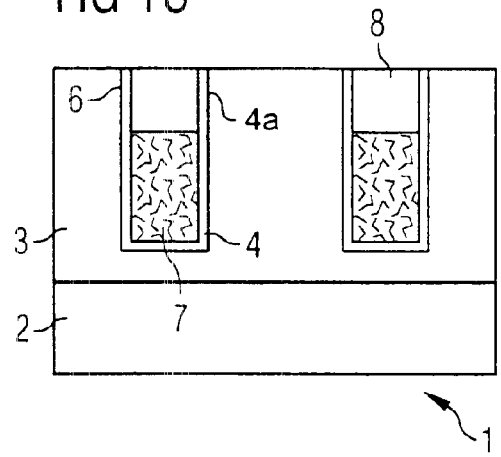
Figure 1B:
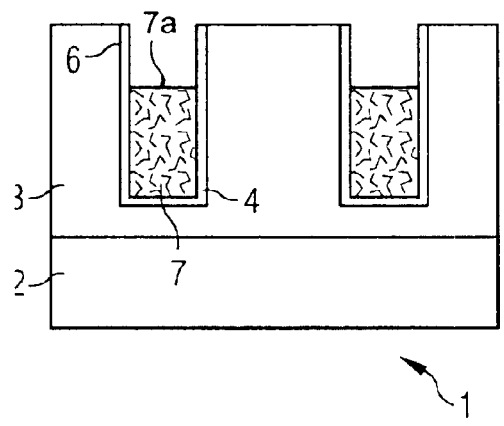

After the silicon dioxide layer 18 has been removed, a gate dielectric 4 made, for example, from silicon dioxide as well is deposited on the inner walls 6 of the trenches 5 by deposition. Then, a gate electrode 7 made from doped polycrystalline silicon is applied in the interior of the trenches 5 (i.e., the lower region 5a) or inside the gate dielectric 4 by deposition and is etched back, resulting in the structure shown in FIG. 1B. The gate electrode 7 has a top side 7a.

Then, an insulating plug 8 is formed in the upper region 5c of the trench 5 as an intermediate oxide including, for example, silicon dioxide. This results in the structure shown in FIG. 1C. The insulating plug 8 has a surface 8a.

Figure 1D:
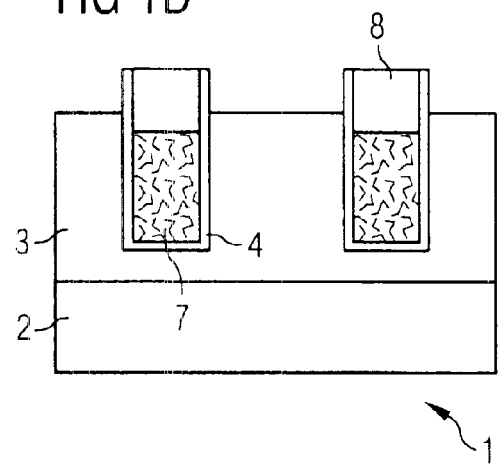

This is then followed by etching back of the mesa region, so that the insulating plugs 8 with an upper end 4a of the gate dielectric 4 surrounding them project partly above the surface of the drift zone 3 which remains. The mesa region is etched back as far as approximately just above the gate electrode 7. This results in the structure illustrated in FIG. 1D.

Then, as shown in FIG. 1E, a p-conducting body region 9 is introduced in the surface region of the drift zone 3 by using at least one implantation step followed by subsequent expulsion or a heat treatment. The body region 9 has a top surface 9a that ultimately defines a top 9b of the transistor.

Then, conductive spacers are applied to the side walls of the gate dielectric 4 projecting above the surface 9a of the body region 9, as shown in the left-hand half of FIG. 1F. The conductive spacers 10 may include, for example, of n-doped polycrystalline or amorphous silicon or of a metal provided with dopant or of phosphosilicate glass (PSG) or of borophosphosilicate glass (BPSG) or of borosilicate glass (BSG). If appropriate, the conductive spacers 10 may also be underlaid with an optional insulating spacer layer 10a made of, for example, silicon dioxide, as shown in the right-hand part of FIG. 1F. These spacers 10 or 10a in each case act as dopant sources during a subsequent heat treatment.

Then, the dopant is expelled from the spacer 10 that serves as a dopant source by using a heat treatment, so that after the dopant has been expelled from the spacers 10, n-conducting source zones 11 are formed in the body region 9 through diffusion. The lower edge 11a of the source zone 11 in this case lies at a lower level than the top side, adjoining the insulating plug 8, of the gate electrode 7. This results in the structure illustrated in FIG. 1G. It is also possible for the doping for the body region 9 only to be carried out after diffusion of the source zone 11.

Finally, an electrical contact for the source zone 11 and/or the body region 9 is produced with the aid of a metalization 12 made from, for example, aluminum on the main surface of the transistor. This metalization 12 may also be underlaid with a layer 13 that is made of a silicide and an implanted body contact. This layer 13 is intended to improve electrical contact between the metalization 12 and the source zone 11 and the body region 9. FIG. 1H shows the structure of the trench transistor obtained in this way, in which the channel zone runs along the gate dielectric 4 in the body region 9.

In the case of a vertical configuration, a drain contact (not shown in the figures) is also applied to the back surface of the semiconductor body 1. A lateral configuration, by contrast, provides for an additional metalization, which is separate from the metalization 12, as a drain contact, which is connected via an n⁺-conducting sinker zone, through the body region 9, to the layer 2 and the drift zone 3.

If appropriate, it is also possible for a body contact region to be introduced into the body region 9 by implantation, with the spacer 10 in this case being used as a mask. Then, the layer 13 is applied to this body contact region. The metalization used is, for example, AlSiCu or a plug of polycrystalline silicon (polyplug) with AlSiCu.

FIGS. 2A to 2H show sections illustrating a further exemplary embodiment of the present invention. In these figures, the method steps which have been explained with reference to FIGS. 1A to 1F correspond to the method steps used to form a structure shown in FIG. 2F. In the present exemplary embodiment, the spacer 10 preferably does not extend all the way to the upper edge 4a of the silicon dioxide layer 4. After the structure shown in FIG. 2F has been obtained in this way, an insulating spacer layer 10b is also applied to the conductive spacer 10. Then, a trench etch is carried out in order to form a trench 14 in the body region 9. During this trench etch, the insulating spacer layer 10b serves as a mask. The insulating spacer layer 10b may be silicon dioxide or silicon nitride, as is also used for the insulating spacer layer 10a in the first exemplary embodiment. The trench 14 projects into the body region 9 and also may pass entirely through the latter as far as the drift zone 3 and penetrate into the latter.

Figure 2A:
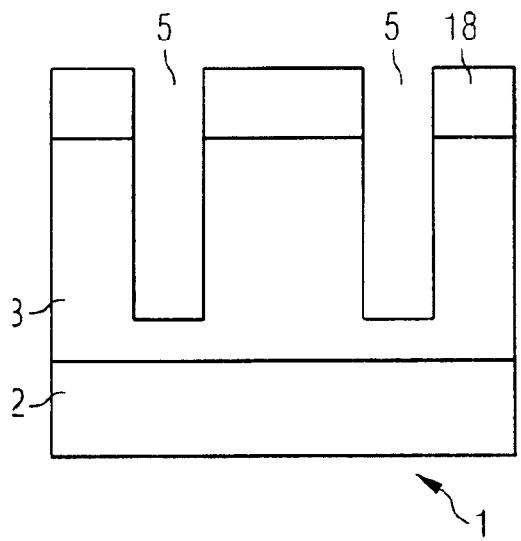
FIGS. 2A–2H are diagrammatic sectional views showing a sequence of steps of a process for fabricating a trench transistor with self-aligned source zone and a trench contact according to a second embodiment of the invention.
Figure 2C:
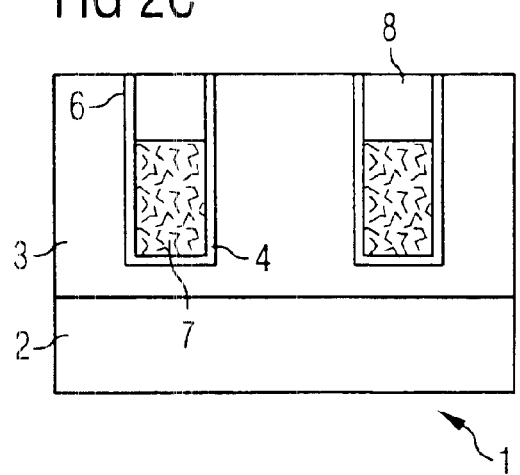
Figure 2B:
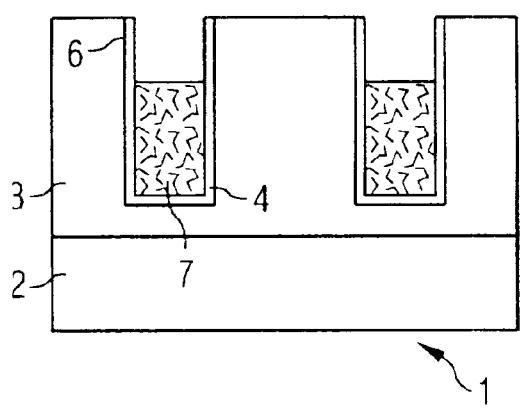
Figure 2D:
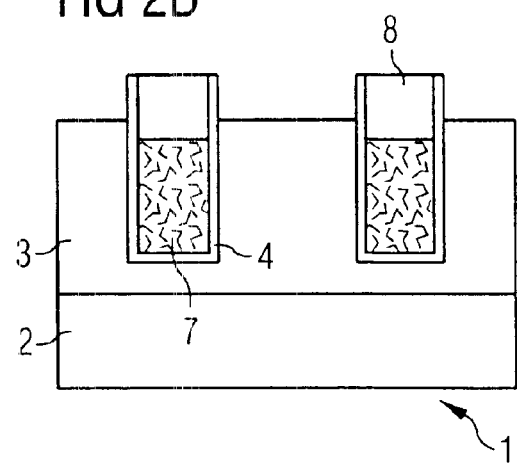
Figure 2E:
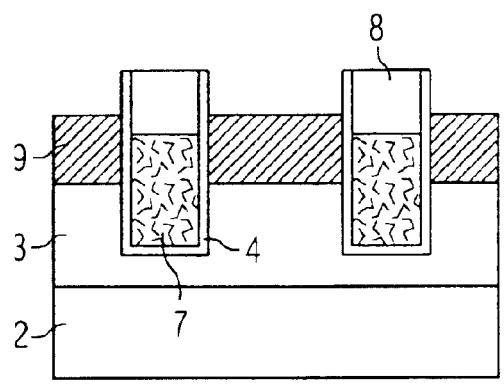
Figure 2G:
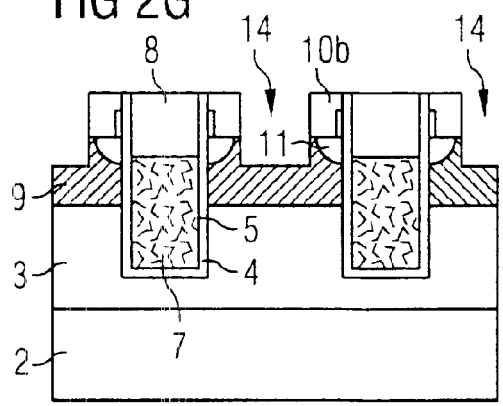
Figure 2F:
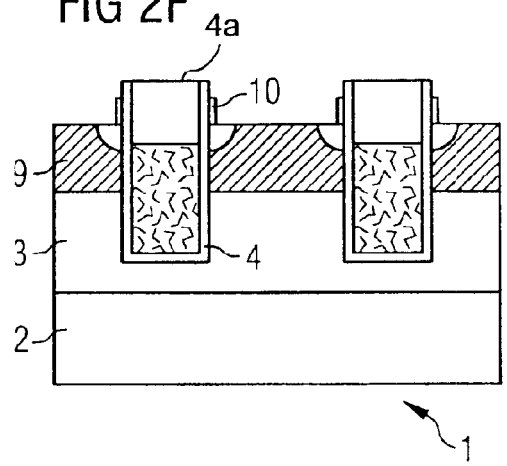
Figure 2H:
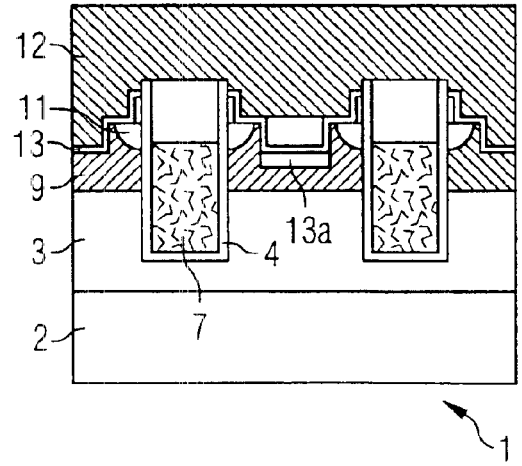

It is also possible for the insulating spacer layer 10a (cf. FIG. 1F) additionally to be provided beneath the conductive spacer 10 in the present second exemplary embodiment and for this insulating spacer layer 10a to be applied to the side edge of the silicon dioxide layer 4 directly before or after the implantation of the body region 9, i.e. before or after the method steps illustrated in FIGS. 1E and 2E. This insulating spacer layer 10a thickens the gate dielectric formed by the silicon dioxide layer 4. It is therefore possible to compensate for damage to the gate dielectric in the event of the mesa etchback being too deep (cf. FIGS. 1D and 2D).

In the present second exemplary embodiment, the insulating spacer layer 10b is removed or etched back, so that the source zone 11 can be successfully connected to the metalization 12. This connection is performed in the same or in a similar way to in the first exemplary embodiment, i.e. preferably via the layer 13 formed in the manner explained above.

Figure 3A:
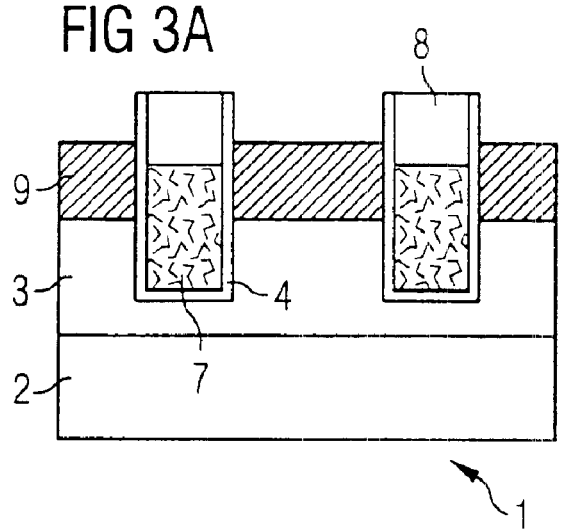
Figure 3B:
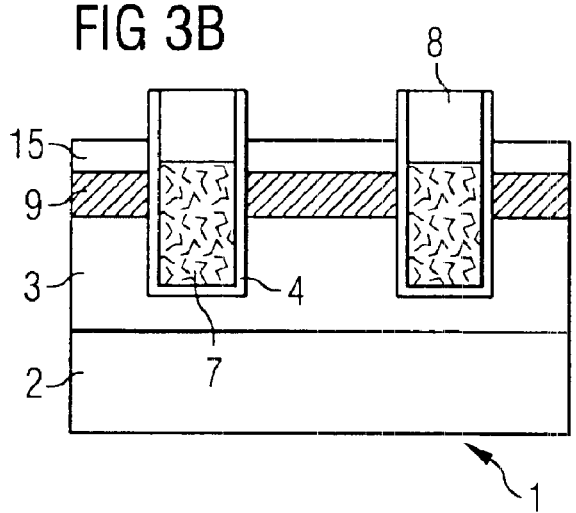
Figure 3C:
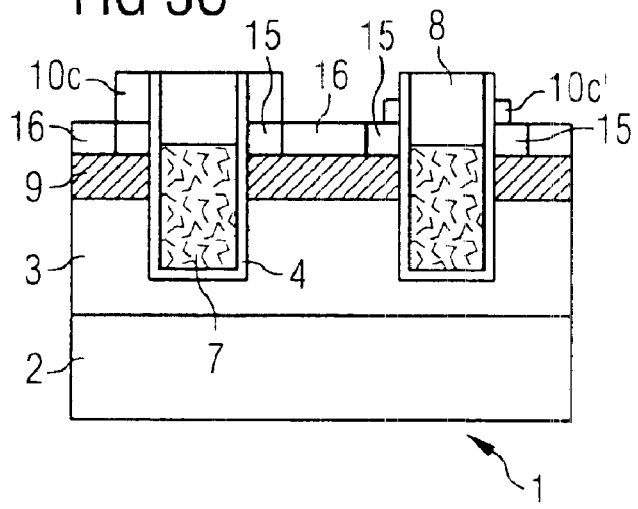

The text that follows will explain a third exemplary embodiment of the trench transistor according to the invention with reference to FIGS. 3A to 3E. FIG. 3A in this case corresponds to FIG. 1E or 2E, meaning that as far as the production of the structure illustrated in FIG. 3A the process steps are identical to those used in the first and second exemplary embodiments.

In the structure shown in section in FIG. 3A, a lightly doped n-conducting source zone 15 is introduced into the body region 9, preferably by implantation, which is expedient especially for the fabrication of p-channel transistors. In the region of the source zone 15, therefore, the doping of the body region 9 is reversed. This results in the structure shown in FIG. 3B.

Then, an insulating spacer layer 10c is applied to the edge of the silicon dioxide layer 4 in order for a p⁺-conducting body contact zone 16 to be implanted via this insulating spacer layer 10c. The insulating spacer layer 10c can be removed or simply etched back, so that it serves as a spacer layer 10c' (cf. right-hand half of FIG. 3C) for thickening the silicon dioxide layer (GOX) which forms the gate dielectric 4. This therefore results in the structure illustrated in FIG. 3C.

Finally, a metalization 12 is also applied, in the same way as in the first or second exemplary embodiment.

In all the exemplary embodiments, the surface topography can be flattened prior to the step of depositing the metalization 12, using a CMP step (CMP=Chemical Mechanical Polishing), in order to achieve improved filling properties for the metal of the metalization 12. A correspondingly configured structure is illustrated in FIG. 3E. The CMP step makes it possible to avoid height differences.

In addition to the gate electrode 7, it is also possible for further electrodes and if appropriate also a field plate to be formed in the trench 5. This preferably takes place as early as after the trench etch, i.e. after the steps corresponding to FIGS. 1A and 2A. An additional electrode 7a of this type is shown in the left-hand half of FIG. 3E, beneath a further insulation layer 4a, while FIG. 3E', which otherwise corresponds to the right-hand half of FIG. 3E, illustrates a field plate 17 inside a field plate trench with a thick insulation layer 19 of silicon dioxide in the lower region of the trench 5, which preferably extends as far as the layer 2.

We claim:

1. A trench transistor, comprising:
   a semi-conductor body of a first conduction type having a surface region;
   a semiconductor region of a second conduction type opposite to said first conduction type provided in said surface region of said semiconductor body and having a top surface;
   a trench formed in said semiconductor body and said semiconductor region and extending from said top surface of said semiconductor region to a level below said semiconductor region, said trench having a wall, a lower region, and an upper region;
   an insulation layer at least partially lining said wall of said trench and having an upper end;
   a conductive trench filling disposed in said lower region of said trench and having a top side;
   an insulating trench filling disposed in said upper region of said trench, having a top surface, and adjoining said top side of said conductive trench filling; and
   a semiconductor zone of said first conduction type provided along said insulation layer in said semiconductor region and having a lower edge;
   said upper end of said insulation layer and said top surface of said insulating trench filling at least partially disposed above said surface of said semiconductor region;
   said lower edge of said semiconductor zone being curved and lying lower than said top side of said conductive trench filling;
   a spacer provided along said insulation layer and disposed above said top surface of said semiconductor region and serving as a dopant source for said semiconductor zone; and
   a channel zone running along said insulation layer in said semiconductor region.

2. The trench transistor according to claim 1, wherein said top surface of said semiconductor region has a an additional trench formed between two cells.

3. The trench transistor according to claim 1, further comprising a silicide layer in contact with said semiconductor region and said semiconductor zone.

4. The trench transistor according to claim 1, wherein said semiconductor region has a contact zone.

5. The trench transistor according to claim 4, wherein said contact zone is implanted.

6. The trench transistor according to claim 1, further comprising an insulating spacer layer underlying said spacer.

7. The trench transistor according to claim 6, wherein said insulating spacer layer is made of a material selected from the group consisting of silicon nitride and silicon oxide.

8. The trench transistor according to claim 1, wherein said spacer is made of a material selected from the group consisting of polycrystalline silicon, a metal provided with dopant, borophosphosilicate glass, phosphosilicate glass, and borosilicate glass.

9. The trench transistor according to claim 1, wherein said semiconductor body is made from a material selected from the group consisting of silicon, silicon carbide, and a compound semiconductor.

10. The trench transistor according to claim 1, further comprising additional electrodes disposed in said trench.

11. The trench transistor according to claim 1, further comprising a field plate disposed in said trench.

* * * * *